United States Patent [19]

Pinkhasov

[11] Patent Number: 5,045,344
[45] Date of Patent: Sep. 3, 1991

[54] METHOD OF MAKING REFLECTIVE ARTICLES

[75] Inventor: Eduard Pinkhasov, Eastchester, N.Y.

[73] Assignee: Vapor Technologies, Inc., Mt. Vernon, N.Y.

[21] Appl. No.: 437,834

[22] Filed: Nov. 16, 1989

[51] Int. Cl.$^5$ .............................................. B05D 3/06
[52] U.S. Cl. .................................... 427/37; 427/126.5; 427/228; 427/294
[58] Field of Search ................ 427/37, 294, 42, 228, 427/12, 126.5

[56] References Cited

U.S. PATENT DOCUMENTS

| | | | |
|---|---|---|---|
| 2,946,700 | 7/1960 | Day | 427/37 |
| 4,085,248 | 4/1978 | Zehender et al. | 427/35 |
| 4,337,607 | 3/1983 | Yoshida et al. | 427/294 |
| 4,407,871 | 10/1983 | Eisfeller | 427/294 |
| 4,540,596 | 9/1985 | Nimmagadda | 427/37 |
| 4,842,710 | 6/1989 | Freller et al. | 427/37 |
| 4,929,322 | 5/1990 | Sue et al. | 427/37 |

OTHER PUBLICATIONS

Hackh's Chemical Dictionary, p. 28.

Primary Examiner—Michael Lusignan
Assistant Examiner—Diana Dudash
Attorney, Agent, or Firm—Herbert Dubno

[57] ABSTRACT

Highly reflective surfaces, e.g. for headlight reflectors for automotive vehicles can be made by low temperature arc vapor deposition from a mixed metal electrode in which the electrode consists of a mixture of powders of a reflective or relative low melting metal and a ceramic forming high melting metal. The deposit is formed under conditions in which the mixed metals are fully reacted on deposition so that the coating is not susceptible to oxidation in use and requires no protective coating.

17 Claims, 1 Drawing Sheet

METHOD OF MAKING REFLECTIVE ARTICLES

CROSS REFERENCE TO RELATED APPLICATIONS

This application is related to the following commonly assigned copending applications:

Ser. No. 07/220,549, filed July 18, 1988 (U.S. Pat. No. 4,924,135);

Ser. No. 07/226,413, filed July 29, 1988;

Ser. No. 07/208,886, filed June 17, 1988 (U.S. Pat. No. 4,975,230);

Ser. No. 07/272,557, filed Nov. 16, 1988 (U.S. Pat. No. 4,955,135); and

Ser. No. 07/276,068, filed Nov. 25, 1988 (U.S. Pat. No. 4,931,306).

Reference may also be had to the patents and applications mentioned therein and the references in the files thereof.

BACKGROUND OF THE INVENTION

In the formation of articles having reflective surfaces, such as a reflector for automotive vehicle headlights, it has been the prior practice to provide a reflective coating of a metal, e.g. silver or aluminum, on the surface of a preformed synthetic resin or plastic substrate, and to coat the reflective surface thus formed with a protective layer, e.g. of a transparent lacquer which may also be a synthetic resin material.

The reason for the protective coating, of course, is that the reflective layer is mechanically sensitive, i.e. abrades readily upon contact, and is susceptible to oxidation in the atmosphere, an oxidative reaction giving rise to a change in the reflectivity properties.

The principal drawback of the earlier system for fabricating such reflectors, therefore, is that it requires the application of a protective coating, frequently from a solvent based system in an environmentally hazardous and expensive procedure. The cost of the reflective body, therefore, is relatively high.

Mention may also be made of the fact that it is frequently desirable to control the degree of reflectivity of a particular surface applied to a synthetic resin substrate. This is not easily done with conventional processes.

Furthermore, reference may be had to the state of the art involving arc techniques for forming a deposit of a material on a surface. In arc sputtering and other techniques of this type, there is a substantial problem with droplet spattering, an effect which is detrimental to the uniformity of the coating which is applied. It has thus been long desired, utilizing arc techniques, to avoid droplet spattering.

OBJECTS OF THE INVENTION

It is the principal object of my present invention to provide an improved method which extends the principles of the above-identified copending applications to the fabrication of reflective articles.

Another object of this invention is to provide a method of making reflective articles, i.e. articles with reflective surfaces, so that the drawbacks of earlier methods are avoided.

Another object of this invention is to provide a method of making a reflective article with improved control of the reflectivity of the reflective surface.

Yet another object of this invention is to provide a method of arc coating which substantially eliminates the problem hitherto encountered of droplet spattering.

SUMMARY OF THE INVENTION

I have now found, quite surprisingly, that it is possible to produce reflective articles, i.e. articles having a reflective surface, whereby that reflective surface need not be provided with an antioxidative protective layer if the reflective coating is deposited by low temperature arc vapor deposition from an electrode combining two metals under conditions in which the deposit will be chemically saturated and of a ceramic nature, thereby preventing oxidative reactions subsequently.

According to the invention, the two metals include a first metal which contributes the reflectivity, i.e. is a metal normally used to produce reflective surfaces on a substrate while the second metal is a metal which can form ceramic compounds with nitrogen or carbon, i.e. nitrides and carbides. In particular, the first metal may be silver or aluminum and the second metal may be tungsten and a low temperature arc is struck between the electrode of mixed metals and a counterelectrode, e.g. also of mixed metals, in a space maintained under a subatmospheric pressure (preferably no higher than $10^{-3}$ bar and more advantageously less than $10^{-4}$ bar and still more advantageously less than $10^{-5}$ bar), in juxtaposition with a substrate to be coated, while another substance, either nitrogen or carbon or contributing nitrogen or carbon is admitted to the space.

Specifically, the mixed metal electrode should be formed by hot pressing the mixed powder mass of the two metals at a temperature less than the melting point of the lower melting of the two metals to a cohesive structure. It is important that the two metals in the electrode not alloy with one another or materially fuse together.

Advantageously, the electrode may consist of the reflective metal and the ceramic forming metal, i.e. the first and second metal in a weight ratio of 20:80 to 80:20 and preferably 25:75 to 45:55. Best results are achieved in the range of 30:70 to 50:50.

The importance of carrying out the coating formation under conditions under which the metals deposit as a mixed metal ceramic, i.e. an aluminum tungsten carbide or nitride or a silver tungsten carbide or nitride which is chemically saturated to prevent later oxidation, cannot be stressed too highly.

By chemical saturation here I mean conditions under which practically all bonding capacity of the mixed metal coating is saturated with nitrogen or carbon, either by actual chemical bonds or interstitial trapping of the nitrogen or carbon. The existence of this state can be tested simply by measuring the reflection of the coat after it is formed, subjecting the coating to a pure oxygenation atmosphere at an elevated temperature, 50°–80° C., and then measuring the reflectivity once again. A saturated coating will, of course, show no significant change in reflectivity.

Using the system described, reflectivities in excess of 75% have been readily attainable and the process has been found to be particularly useful for the fabrication of headlight reflectors since it eliminates the need for protective coatings on the reflective surface and the drawbacks which such protective coatings entail.

The method, in accordance with this aspect of the invention, therefore, comprises the steps of:

(a) forming an electrode from a nonalloy mixture of two metals including a highly reflective first metal and a second metal capable of reaction with another substance to form a ceramic;

(b) juxtaposing the electrode with a substrate to be provided with a reflective coating in an evacuatable space;

(c) evacuating the space to a pressure of at most $10^3$ bar;

(d) striking a low-voltage arc between the electrode and another electrode to vaporize the mixture;

(e) admitting the substance into the space to react the substance with the vaporized mixture and cause deposition of a reflective reaction product of the mixture and the substance on the substrate; and (f) controlling the composition of the mixture, the pressure, and the admission of the substance to the space so that the substance chemically saturates the reaction product to prevent oxidative change in reflective properties thereof without the need for a protective coating on the reaction product.

According to another aspect of the invention, reflective coatings can be formed in the manner described above with the possibility of controlling the reflectivity. I have discovered that the reflectivity of a coating deposited using a mixed metal electrode in the presence of a nitrogen or carbon donor will depend upon the thickness of the coating applied. Coatings may be applied in thickness ranges of 800–1500 angstroms, preferably 800–1000 angstroms, with the reflectivity increasing as the thickness increases.

In still another aspect of the present invention, I have fully found that utilizing an electrode of mixed metal powders formed as described above by hot pressing without alloying can eliminate completely the tendency to droplet spatter which was previously associated with arc techniques where one of the metals is a relatively low melting point metal and another of the metals is a high melting point metal.

The high melting point metal/low melting point metal weight ratio should be 80:20 to 20:80, preferably 75:35 to 45:55 with best results in the range of 70:30 to 50:50 (inclusive). The high melting metal may be tungsten and the low melting metal may be silver or aluminum in the example here involved.

For reasons which I have not yet been able to fully establish, the use of the improved electrode of the invention allows coatings of the mixed metals to be formed or ceramic like coatings of the type described as reflective coatings to be produced without the droplet spatter previously associated with arc techniques.

BRIEF DESCRIPTION OF THE DRAWING

The above and other objects, features and advantages of my invention will become more readily apparent from the following description, reference being made to the accompanying highly diagrammatic drawing in which.

SPECIFIC DESCRIPTION

Figure 1:
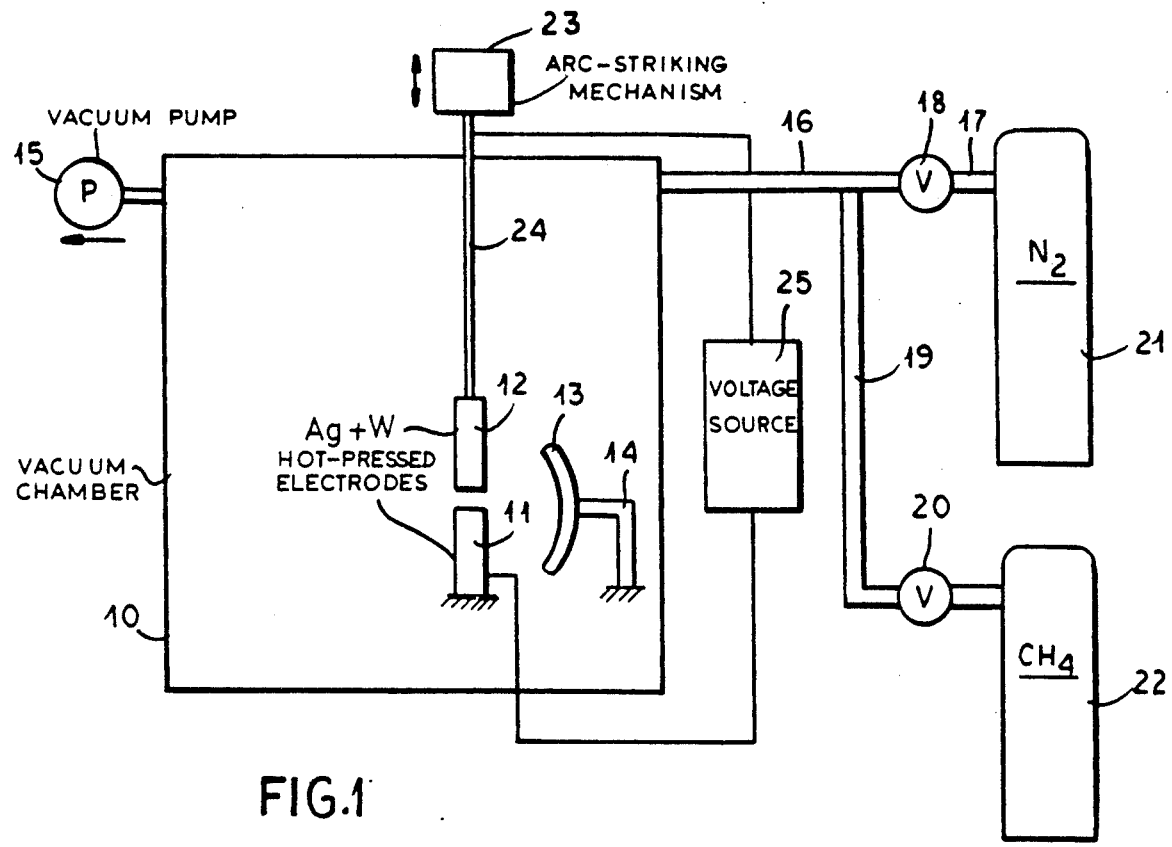
FIG. 1 is a diagram illustrating the formation of a coating in accordance with the present invention.

As can be seen from FIG. 1, a pair of hot pressed electrodes 11 and 12 consisting of silver and tungsten, are juxtaposed with one another across a space in a chamber 10 evacuated by a vacuum pump to a subatmospheric pressure. The vacuum pump is represented at 15.

An arc-striking mechanism 23 is connected by a rod 24 to the movable electrode 12 to approach the electrode 12 to the electrode 11 for the striking of an arc, the electrode 12 being then drawn away from the electrode 11 to allow the developed arc to vaporize the mixed metals of the electrodes as described in the aforementioned copending application. A direct current voltage source 25 is connected across the electrodes and can supply a voltage of 20 to 150 volts and a current of 30 to 150 amperes.

The substrate 13 may be a synthetic resin (e.g. polyurethane or polycarbonate) reflector body for a headlight and is mounted by a support shown only diagrammatically at 14 in the evacuated chamber.

Nitrogen from a tank 21 may be admitted to the evacuated chamber 10 via lines 16 and 17 and a valve 6 if the coating is to be a nitride ceramic.

If a carbide ceramic is desired, methane, as a carbon carrier, can be fed from a tank 22 via valve 20 and lines 16 and 19 to the chamber.

Of course mixed nitrides and carbides can be formed if the atmosphere in the chamber consists of both nitrogen and methane.

The apparatus of FIG. 1 is operated as previously described for coating. The vacuum pump 15 initially evacuates the chamber 10 and either nitrogen or methane or both can be bled to the chamber to eliminate traces of air therein. If desired, the nitrogen or carbon potential can be reduced by diluting these reactive gasses with argon.

Figure 2:
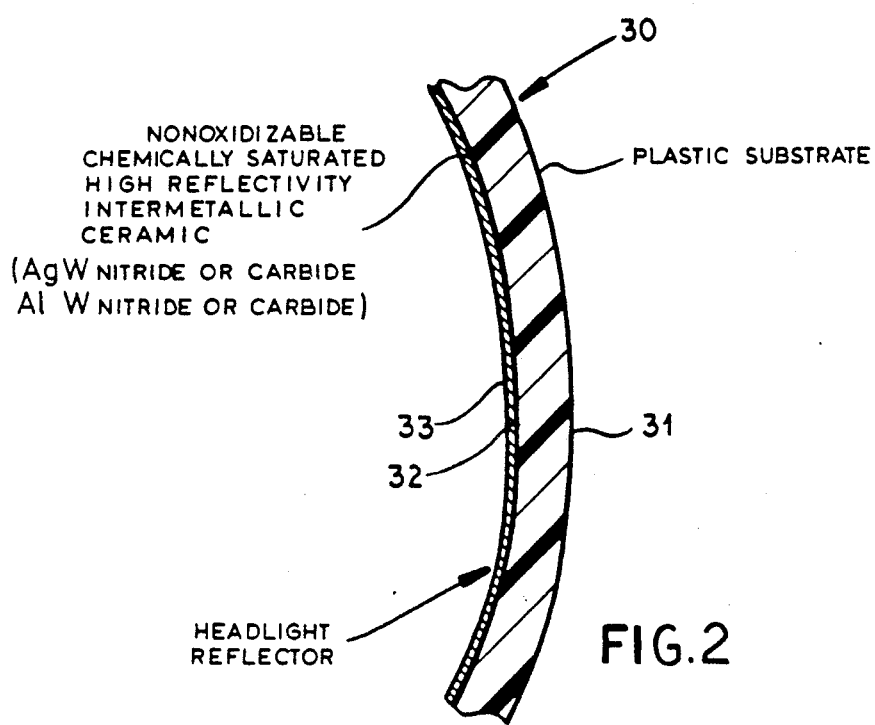
FIG. 2 is a cross sectional view through a headlight reflector made by the method of the present invention.

Previously fabricated electrodes, hot pressed as described, have been positioned in the chamber and are degassified by the evacuation as well and an arc can be struck (repeatedly if desired) while nitrogen and/or methane are admitted to the chamber to deposit a reflective coating 32 on the plastic substrate 31 of the headlight reflector 30 illustrated in FIG. 2, for example. The levels of nitrogen and/or are controlled so that the coating is fully saturated or reacted with carbon and/or nitrogen and thus does not oxidize at the reflective zone 33 subsequently in air. Thus no protective coating need be applied.

The process is completely free from droplet spattering.

Specific Examples

EXAMPLE I

Electrodes 11 and 12 are hot pressed from a mixture of 30% by weight silver powder and 70% by weight tungsten powder. The silver powder and tungsten powder, both of a particle size of 50 to 100 microns are blended thoroughly together before being introduced into a hot pressing mold.

They are hot pressed at a pressure of 100 bar at a temperature of 900° C.

The cooling is carried out utilizing an apparatus generally as described in FIG. 1 utilizing an arc voltage of 100 volts and a current of 40 to 80 amperes. Nitrogen is fed to the chamber and a coating of 1000 angstroms thickness of the mixed nitride is deposited on the polyurethane substrate. The reflectivity is measured at 75% and at 80° C. in a pure oxygen atmosphere, no reduction of reflectivity is observed.

Similar results are obtained when methane is introduced into the chamber.

EXAMPLE II

The process of Example I is followed except that aluminum particles are substituted for silver. The hot pressing is carried out at 600° C. In this example, the hot pressing is carried out under an argon atmosphere.

The headlight reflector which results has a reflectively in excess of 75% and does not require a protective coating on the reflective surface.

I claim:

1. A method of making a reflector, comprising the steps of:
   (a) forming an electrode from a nonalloy mixture of two metals including a highly reflective first metal and a second metal capable of reaction with another substance to form a ceramic;
   (b) juxtaposing said electrode with a substrate to be provided with a reflective coating in an evacuatable space;
   (c) evacuating said space to a pressure of at most $10^{-3}$ bar;
   (d) striking a low-voltage arc between said electrode and another electrode to vaporize said mixture;
   (e) admitting said substance into said space to react said substance with the vaporized mixture and cause deposition of a reflective reaction product of said vaporized mixture and said substance on said substrate in a coating; and
   (f) controlling the composition of said vaporized mixture, said pressure, and the admission of said substance to said space so that said substance chemically saturates said reaction product in said coating to prevent oxidative change in reflective properties thereof without the need for a protective coating on said reaction product, the composition of said mixture, said pressure, the admission of said substance to said space and a thickness of said reaction product on said substrate are selected to provide a reflectivity of at least 75% by said reaction product on said substrate.

2. The method defined in claim 1 wherein said thickness is substantially 800 to 1500 angstroms.

3. The method defined in claim 1 wherein said first metal is selected from the group which consists of silver, aluminum and mixtures thereof.

4. The method defined in claim 3 wherein said second metal is a metal capable of forming ceramic nitrides or carbides.

5. The method defined in claim 4 wherein said second metal is tungsten.

6. The method defined in claim 5 wherein said substance is nitrogen or carbon and said reaction product is a nitride or carbide.

7. The method defined in claim 5 wherein said substance is carbon and is produced by introducing methane to said space.

8. The method defined in claim 5 wherein said first metal and said second metal are present in said electrode in a weight of 80:20 to 20:80.

9. The method defined in claim 8 wherein said weight ratio is substantially 30:70 to 50:50.

10. The method defined in claim 1 wherein said electrode is formed by blending powders of said first and second metals together to form a powder mixture and hot pressing the powder mixture at a temperature below the melting point of the lowest melting of said metals.

11. A headlight reflector made by the method of claim 1.

12. A method of preventing droplet spatter in arc-deposition coating of a substrate, comprising the steps of:
   (a) forming an electrode from a nonalloy mixture of two metals including a low melting point first metal having a tendency to spatter in droplets onto said substrate when an arc is struck with the electrode at a location close to said substrate, and a high melting point second metal, said electrode being formed by blending powders of said first and second metals together to form a powder mixture and hot pressing the powder mixture at a temperature below the melting point of the lower melting of said metals;
   (b) juxtaposing said electrode with said substrate to be provided with a coating containing said first metal in an evacuatable space;
   (c) evacuating said space to a pressure of at most $10^{-3}$ bar; and
   (d) striking a low-voltage arc between said electrode and a counterelectrode to vaporize said mixture and deposit a coating of said mixture on said substrate, whereby spattering of droplets from said electrode onto said substrate is prevented.

13. The method defined in claim 12 wherein said first metal is selected from the group which consists of silver, aluminum and mixtures thereof.

14. The method defined in claim 13 wherein said second metal is a metal capable of forming ceramic nitride or carbide reaction products.

15. The method defined in claim 14 wherein said second metal is tungsten.

16. The method defined in claim 15 wherein said first metal and said second metal are present in said electrode in a weight ratio of 80:20 to 20:80.

17. The method defined in claim 16 wherein said weight ratio is substantially 30:70 to 50:50.

* * * * *